United States Patent [19]
Thompson et al.

[11] Patent Number: 5,224,504
[45] Date of Patent: Jul. 6, 1993

[54] SINGLE WAFER PROCESSOR

[75] Inventors: Raymon F. Thompson, Kalispell, Mont.; Robert W. Gordon, Seattle, Wash.; Daniel Durado, Kalispell, Mont.

[73] Assignee: Semitool, Inc., Kalispell, Mont.

[21] Appl. No.: 922,578

[22] Filed: Jul. 30, 1992

Related U.S. Application Data

[60] Division of Ser. No. 328,888, Mar. 27, 1989, Pat. No. 5,166,886, which is a continuation-in-part of Ser. No. 198,732, May 25, 1988, abandoned.

[51] Int. Cl.$^5$ .............................................. B08B 3/04
[52] U.S. Cl. .................................... 134/155; 134/157; 134/182; 134/200; 134/902
[58] Field of Search ............... 134/153, 157, 200, 182, 134/155, 186, 902

[56] References Cited

U.S. PATENT DOCUMENTS

| | | | |
|---|---|---|---|
| 2,081,142 | 5/1937 | Branaman, Sr. | 134/147 |
| 2,994,331 | 8/1961 | Companys | 134/140 |
| 3,614,959 | 10/1971 | Schullmaier et al. | 134/901 |
| 3,950,184 | 4/1976 | Adams et al. | 134/902 X |
| 3,990,462 | 11/1976 | Elftmann et al. | 134/902 X |
| 4,064,885 | 12/1977 | Dussault et al. | 134/902 X |
| 4,132,567 | 1/1979 | Blackwood | 134/902 X |
| 4,286,541 | 9/1981 | Blackwood | 134/153 X |
| 4,290,687 | 9/1981 | Takahashi | 354/320 |
| 4,339,297 | 7/1982 | Aigo | 156/345 |
| 4,429,983 | 2/1984 | Cortellino | 134/161 X |
| 4,457,419 | 7/1984 | Ogami et al. | 198/345 |
| 4,519,846 | 5/1986 | Aigo | 134/15 |
| 4,588,185 | 5/1986 | Shoda et al. | 271/267 |
| 4,601,627 | 7/1986 | Oka et al. | 414/225 |
| 4,682,614 | 7/1987 | Silvernail | 134/200 X |
| 4,682,615 | 7/1987 | Burkman et al. | 134/902 |
| 4,745,422 | 5/1988 | Matsuoka et al. | 134/902 X |
| 4,788,994 | 12/1988 | Shinbara | 134/157 |
| 4,827,867 | 5/1989 | Takei et al. | 134/902 X |
| 4,838,979 | 6/1989 | Nishida et al. | 134/902 |
| 4,856,641 | 8/1989 | Matsumura et al. | 198/346 |
| 4,923,054 | 5/1990 | Ohtani . | |
| 5,022,419 | 6/1991 | Thompson et al. | 134/902 X |

FOREIGN PATENT DOCUMENTS 52-12576  1/1977  Japan .................................. 134/902

*Primary Examiner*—Frankie L. Stinson
*Attorney, Agent, or Firm*—Wells, St. John, Roberts, Gregory & Matkin

[57] ABSTRACT

A single wafer processor supports a semiconductor wafer having at least one surface that is to be subjected to contact with a fluid. The equipment includes a portable module including a gripper assembly that is rotatable about the axis of a portable housing and is capable of mechanically engaging or disengaging the edge of an individual wafer. The portable module is complementary to a receiving base having an open bowl provided with liquid jets for discharging processing liquids or reagents in parallel streams directed toward the outer surface of a rotating wafer. The bowl can also be filled with liquid for immersion treatment of a wafer, which can be held stationary or rotated at slow speeds. The portable unit is moved between base units by a robotic arm. All elements associated with holding of the wafer are physically shielded to minimize wafer contamination from environmental contact.

5 Claims, 9 Drawing Sheets

SINGLE WAFER PROCESSOR

RELATED APPLICATION

This is a division of U.S. patent application Ser. No. 07/328,888, filed Mar. 27, 1989, now U.S. Pat. No. 5,166,886, which is a continuation-in-part of U.S. patent application Ser. No. 198,732, filed May 25, 1988 (now abandoned).

TECHNICAL FIELD

This disclosure relates to a single wafer processor for holding and transporting individual semiconductor wafers in conjunction with fluid treatment of at least one wafer surface.

BACKGROUND OF THE INVENTION

Chemical processing of semiconductor wafers and similar substrates is often carried out in large batches, where 20 or 30 wafers are immersed in liquid or subjected to liquid sprays as a group. While this is highly effective for rinsing and drying of wafers, as well as for many conventional acid treatments, it is of questionable economy where extremely expensive wafers or substrates are being processed. Not only do such large-scale batch treatments of wafers multiply potential loss due to malfunction in the processing steps, but batch handling of wafers often interrupts the normal individualized handling and development of more expensive and exotic wafers or substrates.

The present invention was developed to minimize such economic losses by handling only a single wafer. It also adapts readily to existing single wafer production techniques common in the semiconductor industry. Furthermore, in contrast with the treatment of large batches of parallel wafers arranged in a stack, the single wafer process as described herein permits treatment of one wafer surface (by application of liquid sprays) as well as both wafer surfaces (by immersion treatment). It also readily accommodates robotic transfer of each wafer between processing units and other automated handling equipment. Indexing and rotation of each wafer can be controlled to meet precise processing requirements. The use of individual bowls in which process steps for single wafers are conducted minimize the amount of liquid required for wafer processing. The smaller volume requirements permit use of fresh liquid to minimize the contamination that might otherwise be encountered when recirculating liquid in larger volume systems.

BRIEF DESCRIPTION OF THE DRAWINGS

The preferred embodiment of the invention is illustrated in the accompanying drawings, in which.

DETAILED DESCRIPTION OF THE PREFERRED EMBODIMENT

The following disclosure of the invention is submitted in compliance with the constitutional purpose of the Patent Laws "to promote the progress of science and useful arts" (Article 1, Section 8).

Figure 2:
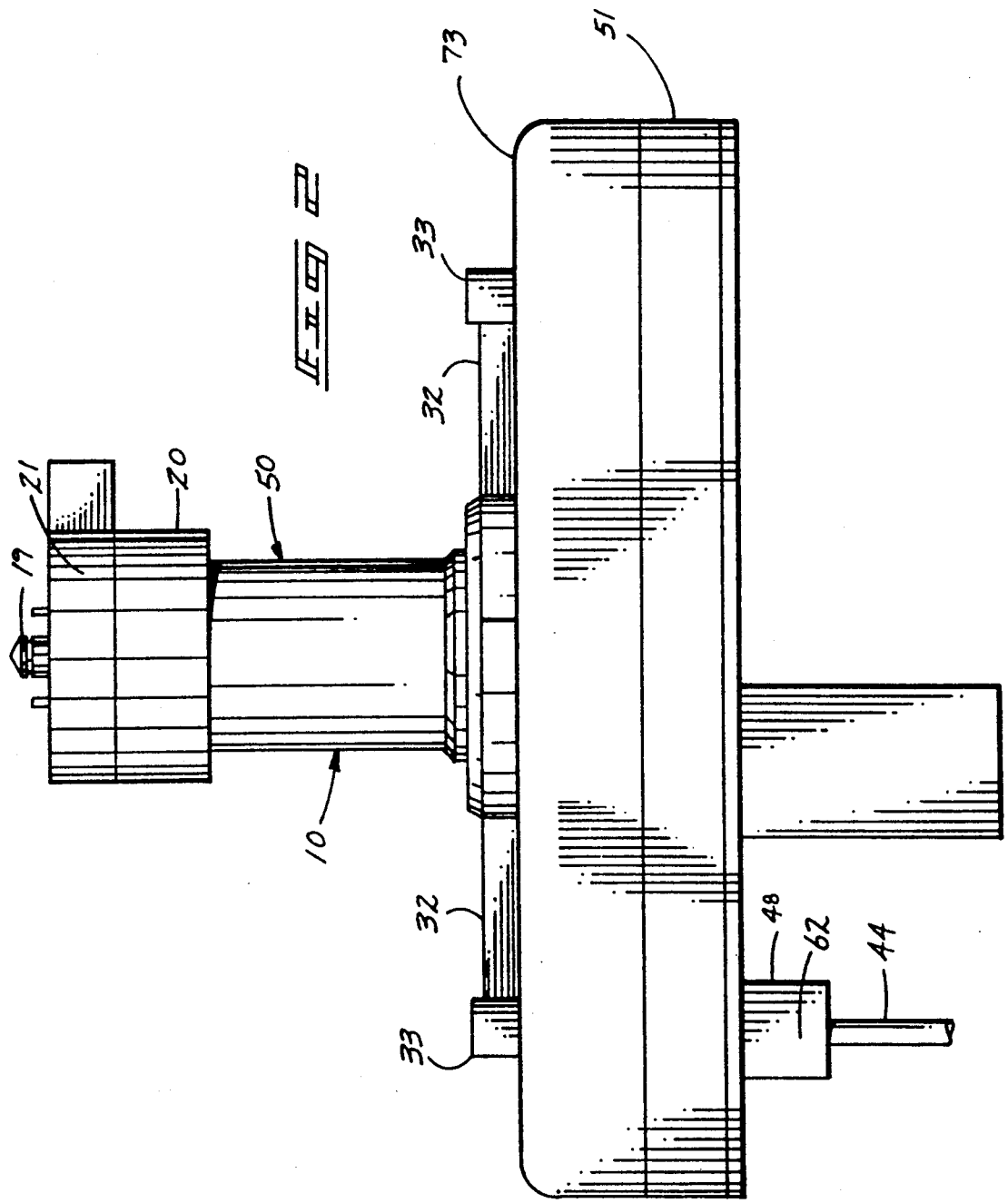
FIG. 2 is a side elevation view of a processor unit.
Figure 3:
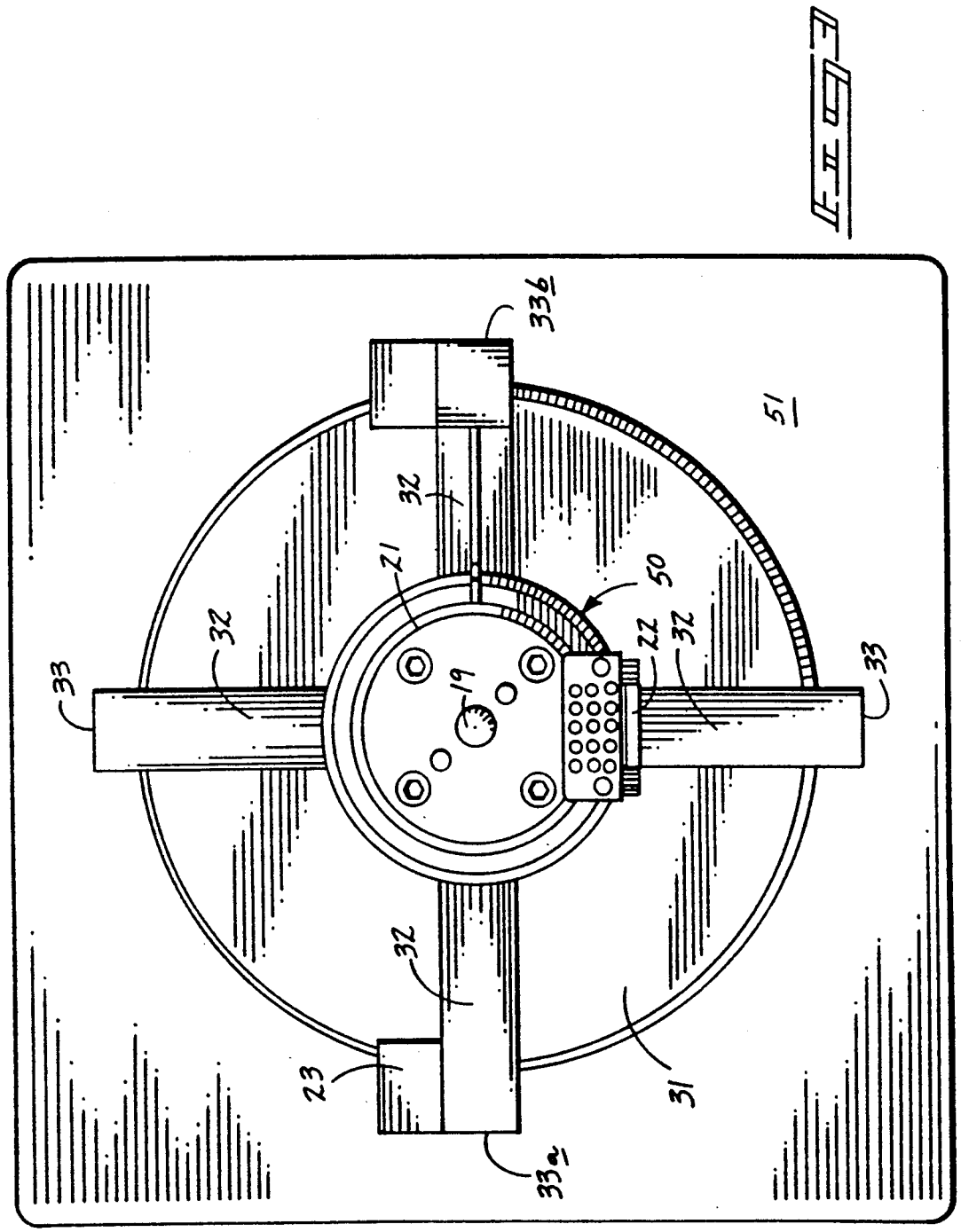
FIG. 3 is a top view of the processor unit shown in FIG. 2.
Figure 5:
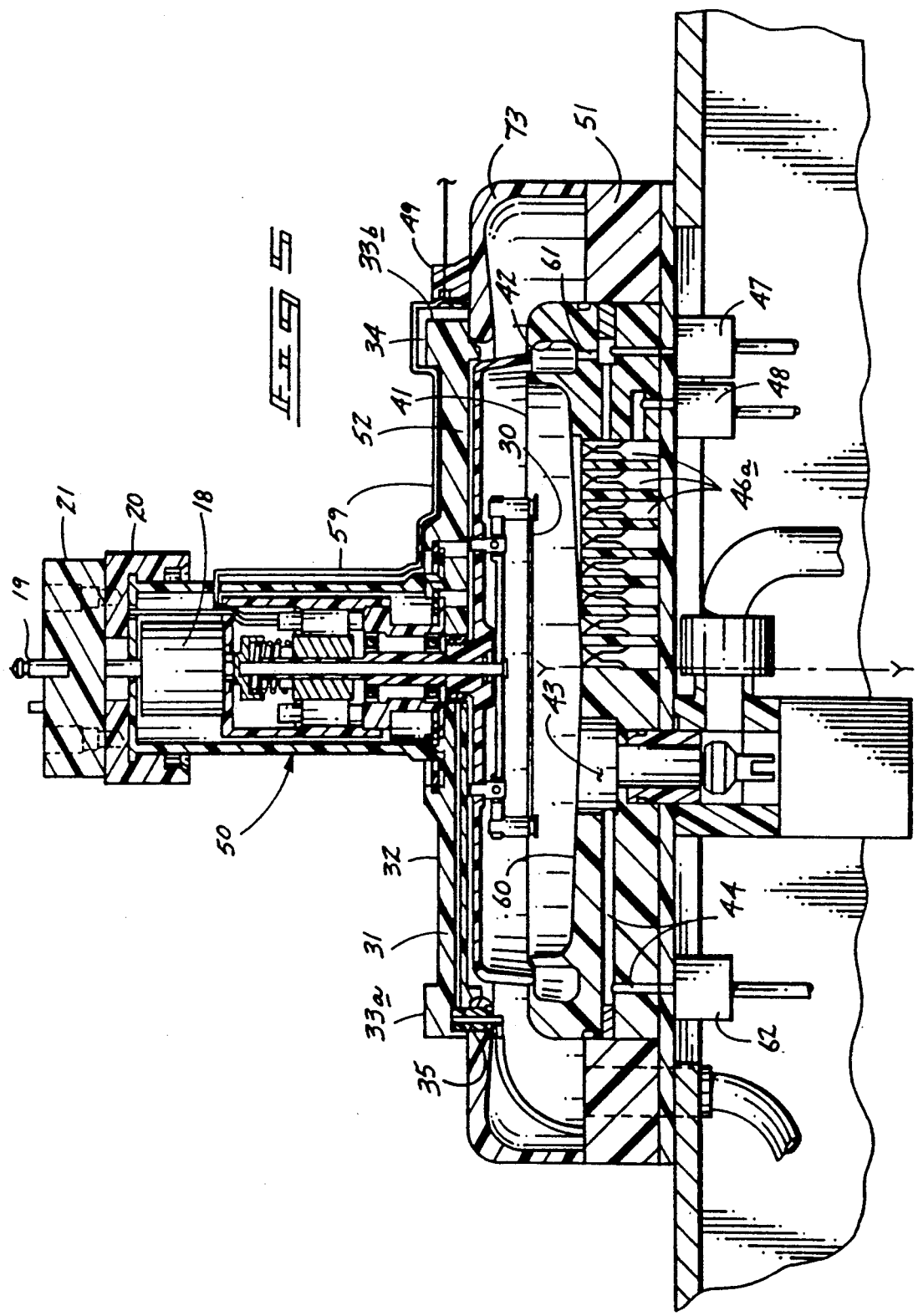
FIG. 5 is a vertical sectional view through the processor unit as seen along line 5—5 in FIG. 4.

The single wafer processor according to this invention has been developed about the processor unit shown in FIGS. 2, 3 and 5, and, more specifically, about the portable module shown in FIGS. 6-9. The portable module 50 is complementary to a receiving base 51, which together comprise the individual processor units as seen in FIGS. 2 and 3.

Portable module 50 is adapted to be moved by a conventional robotic arm 52. The robotic arm 52 can transfer each portable module 50 to or from a loading-/unloading station 53 where wafers are automatically or manually placed within each portable module 50 or removed from it by conventional equipment (not shown). Each portable module 50 can then be transferred to one or more receiving bases 51 mounted in horizontal or upright orientation along upper surfaces 54 and 55 of a processing cabinet 56. The interior of cabinet 56 houses chemical cells 57 for various liquid reagents used in the processing of the wafers. The processing of wafers can be automated by utilization of conventional electronic and pneumatic controls operated through a console shown at 58.

Figure 1:
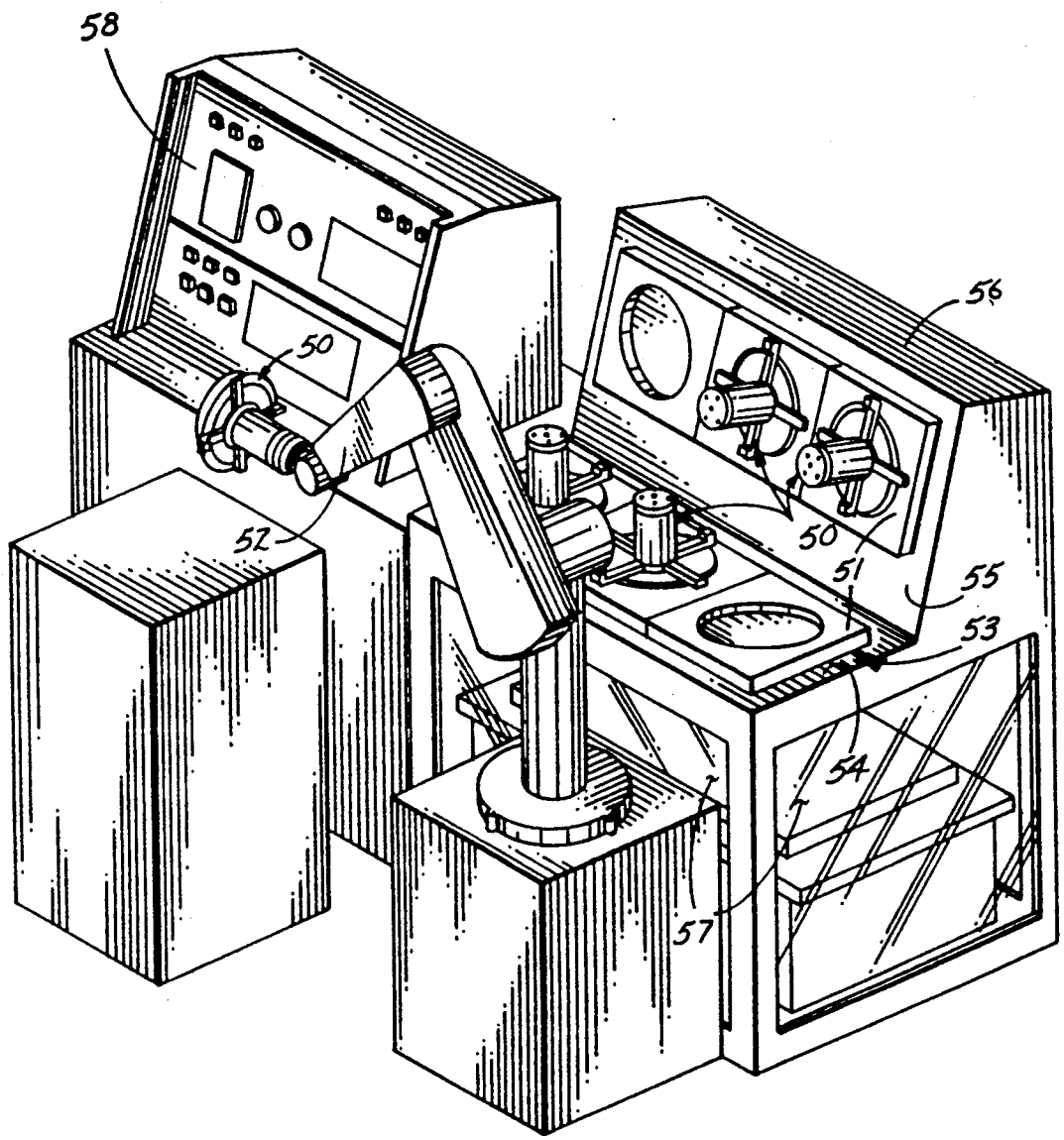
FIG. 1 is a schematic view of the single wafer processing equipment.

The equipment as shown in FIG. 1 is provided in this disclosure only for purposes of illustration to show the general environment in which the single unit processor can be utilized. Further details of the supporting equipment are not necessary in order to understand the nature of the present developments, which relate to the portable module 50 and receiving base 51, as well as to the methods for treatment of single wafers by use of such equipment.

As shown in FIGS. 6-9, each portable module 50 includes a portable housing 10 having a central axis (axis X—X in FIG. 6) and opposed first and second axial ends, shown respectively at the bottom and top of the illustrated cylindrical housing. Gripper means, shown generally at 24, are positioned adjacent the first axial end of the portable housing for selectively engaging the edge of a single wafer 30 (FIGS. 5 and 9) at a plurality of angularly spaced locations arranged about the central axis. Shaft means, shown as a hollow rotatable shaft 13 and an axially shiftable central shaft 14, are movably mounted in the portable housing 10 coaxially with its central axis. The shaft means is operably connected to the gripper means 24 for (1) imparting rotational motion to the gripper means about the central axis and (2) imparting axial motion to the gripper means along the central axis to selectively engage or release the edge of a wafer 30.

First powered means, shown as a rotational electric motor 11, is mounted in the portable housing 10 and is operably connected to the hollow shaft 13 of the shaft means for selectively rotating gripper means 24 about the central axis. A second powered means, shown as a pneumatic cylinder 18, is mounted in the portable housing 10 and is operably connected to the center shaft 14 of the shaft means for selectively imparting axial movement to the gripper means 24. This axial movement shifts the gripper means 24 from a wafer-engaging condition (FIG. 7) for processing of a single wafer to a wafer-releasing condition (FIG. 8) at which a wafer can be inserted into or removed from the gripper means 24.

The elements of the portable module 10 complement a receiving base 51, detailed in FIGS. 2-5.

Each receiving base 51 of the processor units essentially comprises an outwardly open bowl having an interior formed as a dished surface that is centered about a bowl axis (shown at Y—Y in FIG. 5). Jet means 46 in the form of a plurality of sets of parallel liquid jets are provided for directing liquid outwardly from the dished surface 60 to impinge upon the surface of a wafer 30 located in the bowl 41 (see FIG. 5).

The single wafer processing method in which the above equipment is utilized involves the steps of engaging the edge of a wafer by the releasable gripping means centered about central axis X—X on the portable housing 10, moving the portable housing 10 to the location of a complementary open bowl 41 formed about the bowl axis Y—Y on a support surface 54 or 55, mounting the portable housing 10 to the support surface 54 or 55 with the engaged wafer 30 perpendicular to the bowl axis Y—Y, and subjecting at least one surface of the wafer to contact with a fluid, either by immersion or by impinging liquid sprays, while the wafer is located within the bowl interior.

The processing method can also include rotation of wafer 30 about the central axis X—X of the portable housing 10 while subjected to contact with the fluid within bowl 41, whether the wafer 30 is immersed within a liquid contained in the bowl 41 or is subjected to a liquid spray produced by operation of jet means 46. When a liquid spray is used, wafer 30 is preferably rotated about the central axis Y—Y of bowl 41 to provide uniform liquid contact about the entire exposed surface of the wafer and to immediately carry the spent liquid radially outward across the wafer surface to maximize process effectiveness and to continuously subject the wafer surface to contact by fresh liquid or reagent.

To explore the details of the portable module 50, attention is directed to FIGS. 6-9. In these drawings, the hollow shaft 13 provided within the above-described shaft means is rotatably supported in housing 10 by bearings 15 at the lower or first axial end of housing 10. Hollow shaft 13 is surrounded by and operationally rotated through electric motor 11, which is preferably a brushless DC motor capable of rotating the wafers from very slow to very high rotational speeds about the axis X—X (for example, 20 to 2,000 rpm). Motor 11 also includes built-in Hall effect devices which provide the capability of angularly indexing the gripper means 24 about central axis X—X to facilitate loading and unloading of wafers 30 by conventional robotic processes and equipment.

The lower or outer end of hollow shaft 13 is shown as being threadably fixed to the center of a dished circular deflector shield 28 that serves as the principal support member within gripper means 24. Deflector shield 28 and shaft 13 rotate in unison about axis X—X under control of rotational motor 11.

Figure 7:
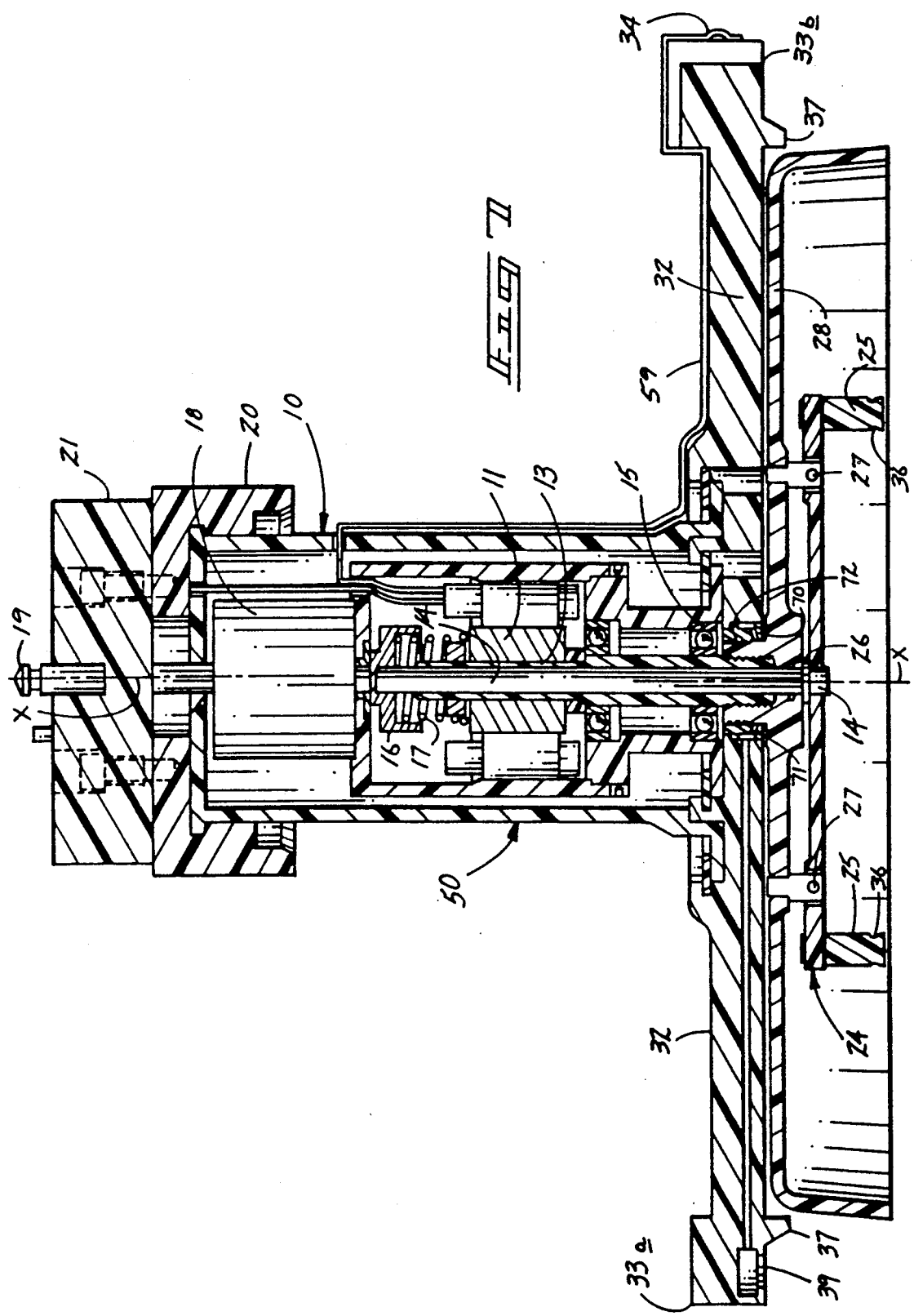
FIG. 7 is an enlarged vertical elevational view through the center of the portable module shown in FIG. 6, also as seen along line 5—5 in FIG. 3.
Figure 8:
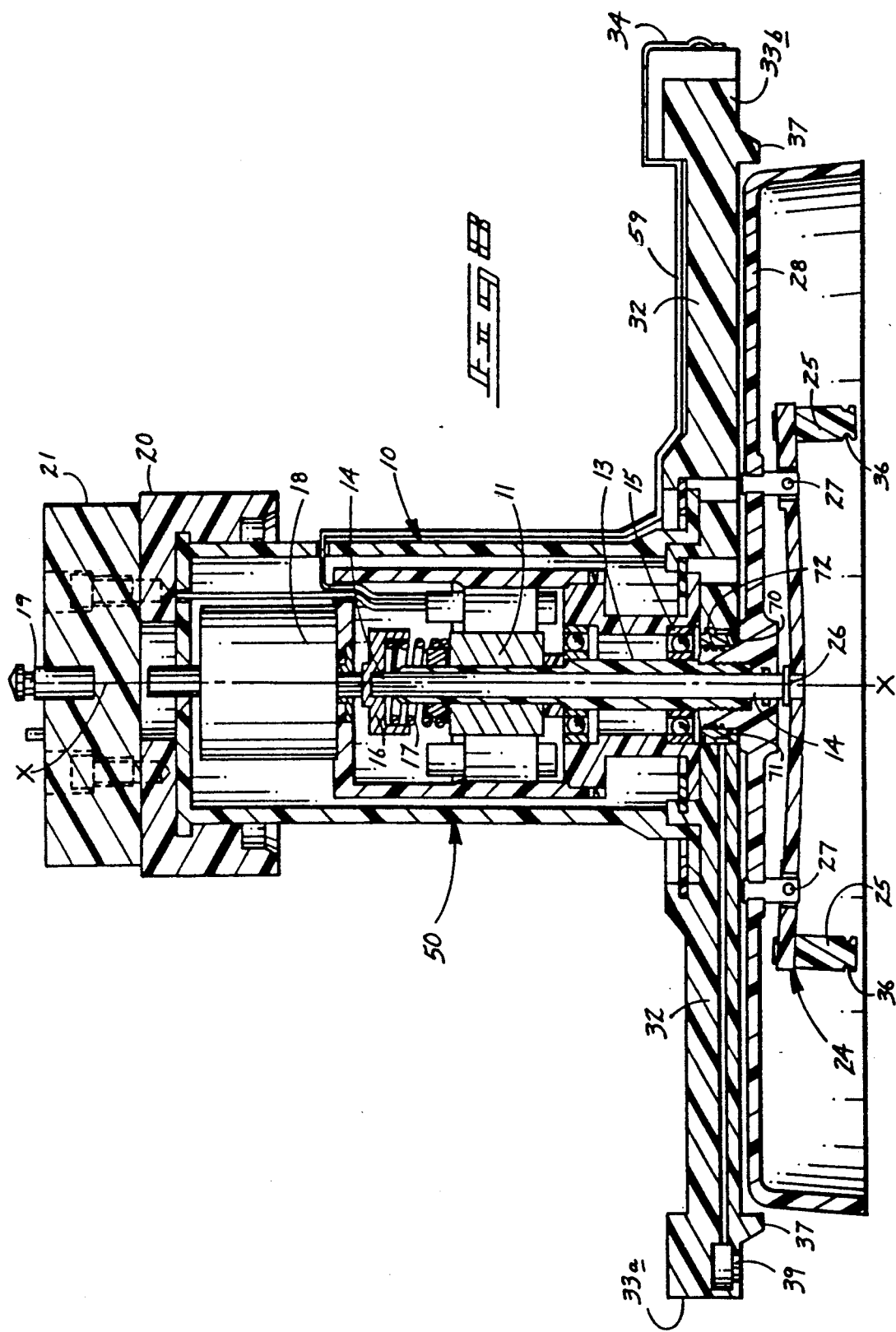
FIG. 8 is a view similar to FIG. 7, showing the gripper in its released position.
Figure 9:
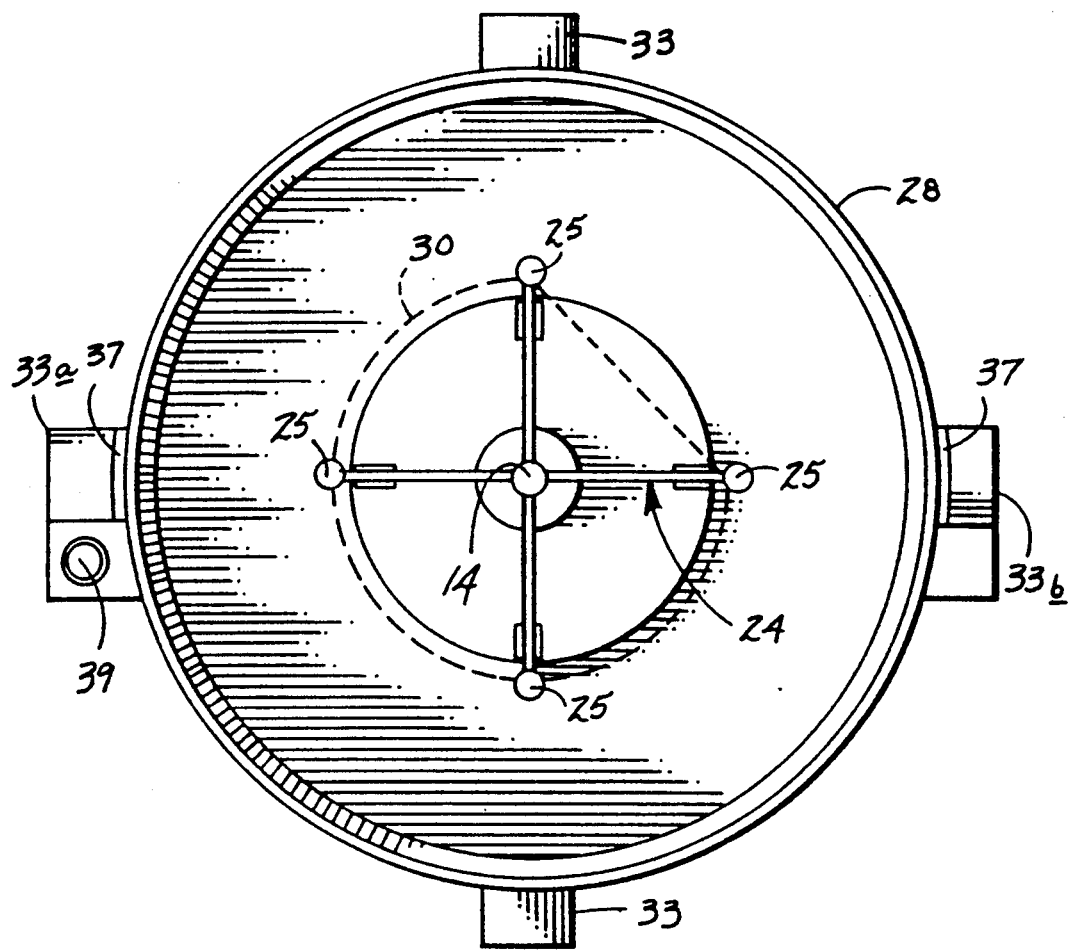
FIG. 9 is a reduced scale bottom view of the portable module shown in FIGS. 6 and 7.

Center shaft 14 projects axially outward beyond both ends of the hollow shaft 13. Its lower or outer end is press fit or otherwise attached to the center of a gripper spring 26. The illustrated gripper spring 26 is formed of resilient material and has a plurality of radial arms that extend from axis X—X in a plane substantially perpendicular to axis X—X and parallel to the adjacent interior surface of the deflector shield 28. The outer end of each arm in the gripper spring 26 mounts a wafer-engaging post 25 that protrudes axially outward in a direction substantially parallel to axis X—X. Each arm of the gripper spring 26 is pivotally supported by an individual fulcrum 27 on the supporting deflector shield 28 at a location intermediate its inner and outer radial ends (FIGS. 7 and 8).

Each post 25 has a transverse surface, shown as a peripheral groove 36, for receiving and engaging the edge of a wafer 30. As the center of gripper spring 26 is shifted axially between the retracted position shown in FIG. 7, which enables the gripper means to hold a wafer or substrate, to the extended loading and unloading position shown in FIG. 8, in which the posts 25 are inclined radially outward or spread apart to release or receive a wafer 30.

The spreading action of the wafer-engaging posts 25 is accomplished by axially shifting the center shaft 14 along axis X—X. Extension of shaft 14 is under control of a single-acting pneumatic cylinder shown at 18, which serves as a linear motor to impart axial movement to shaft 14 relative to the hollow shaft 13 and portable housing 10. It is to be noted that shaft 14 rotates in unison with gripper means 24 and hollow shaft 13, but is also capable of axial movement relative to hollow shaft 13 to operate the gripper means 24 as required during the processing sequences relating to a wafer 30.

The upper or inner end of center shaft 14 rotatably engages an end cap 16 that is biased inwardly within housing 10 by a compression spring 17. Spring 17 is operatively mounted between the shaft 14 and housing 10 and serves as a biasing means normally urging center shaft 14 to its retracted or inner position relative to the supporting portable housing 10. The pneumatic cylinder 18 operates upon the inner end of center shaft 14 in opposition to the biasing force of spring 17.

Figure 6:
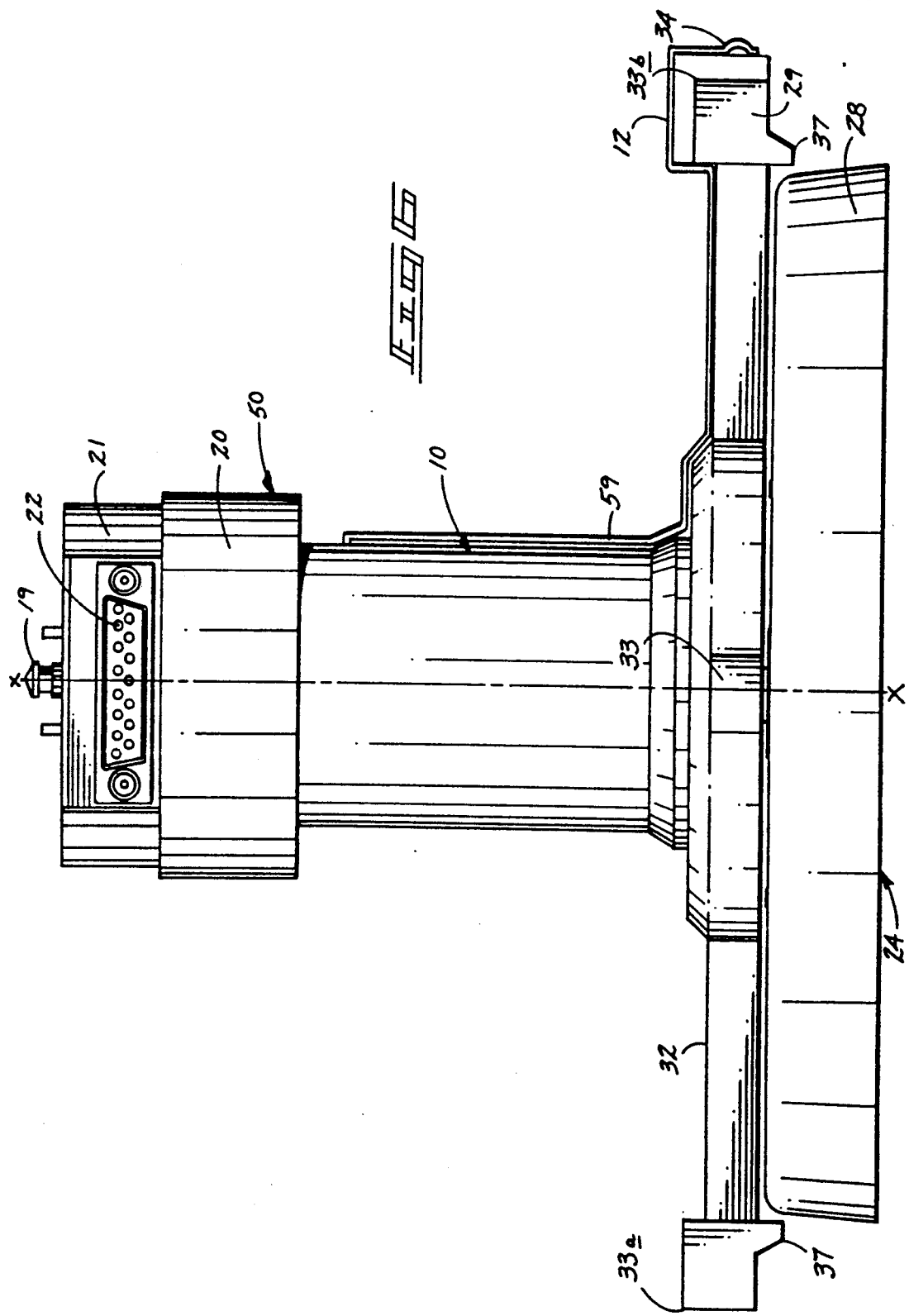
FIG. 6 is an enlarged side elevation view of the portable processor module as seen from the right in FIG. 2.

Portable housing 10 is completed at its second or upper end by an enlarged end cap 20 that mounts a robotic attachment interface or coupling 21 of conventional design. The coupling 21 includes a central clamping post 19, by which a robotic arm 52 can be attached to a selected portable module 50 when desired. Attachment of the robotic arm can complete electrical and pneumatic communications to the robotic structure through exposed electrical contacts 22 on the connector 21, as well as one or more pneumatic ports 23 (see FIG. 3). As shown in FIG. 6, the conventional connector 21 further includes a radially accessible electrical connector 12 and associated pneumatic ports 29.

The portable module is adapted to be selectively associated with one or more base units to complete a single wafer processor unit. As schematically shown in FIG. 1, the combined unit can be in a horizontal position, particularly for immersion processing of wafers, or can be arranged in a vertical orientation or at any inclined orientation, which in some instances will facilitate spray processing of the outer wafer surface. In either instance, the portable module is supported on the receiving base by a rigid radial support flange 31. The flange 31 extends radially outward from the first axial end of portable housing 10 and overlies the gripper means 24.

A plurality of radially protruding feet 33 are fixed about the periphery of flange 31 to serve as mounting means operatively connected between the portable housing 10 and the supporting surface 54 or 55 for selectively holding the portable housing 10 in a fixed coaxial relationship to bowl 41 with the gripper means 24 locating an engaged wafer 30 within the bowl interior. This relationship is best illustrated in sectional FIG. 5. The projecting feet 33 are extensions of reinforcing ribs 32 formed across the top surface of flange 31.

Figure 4:
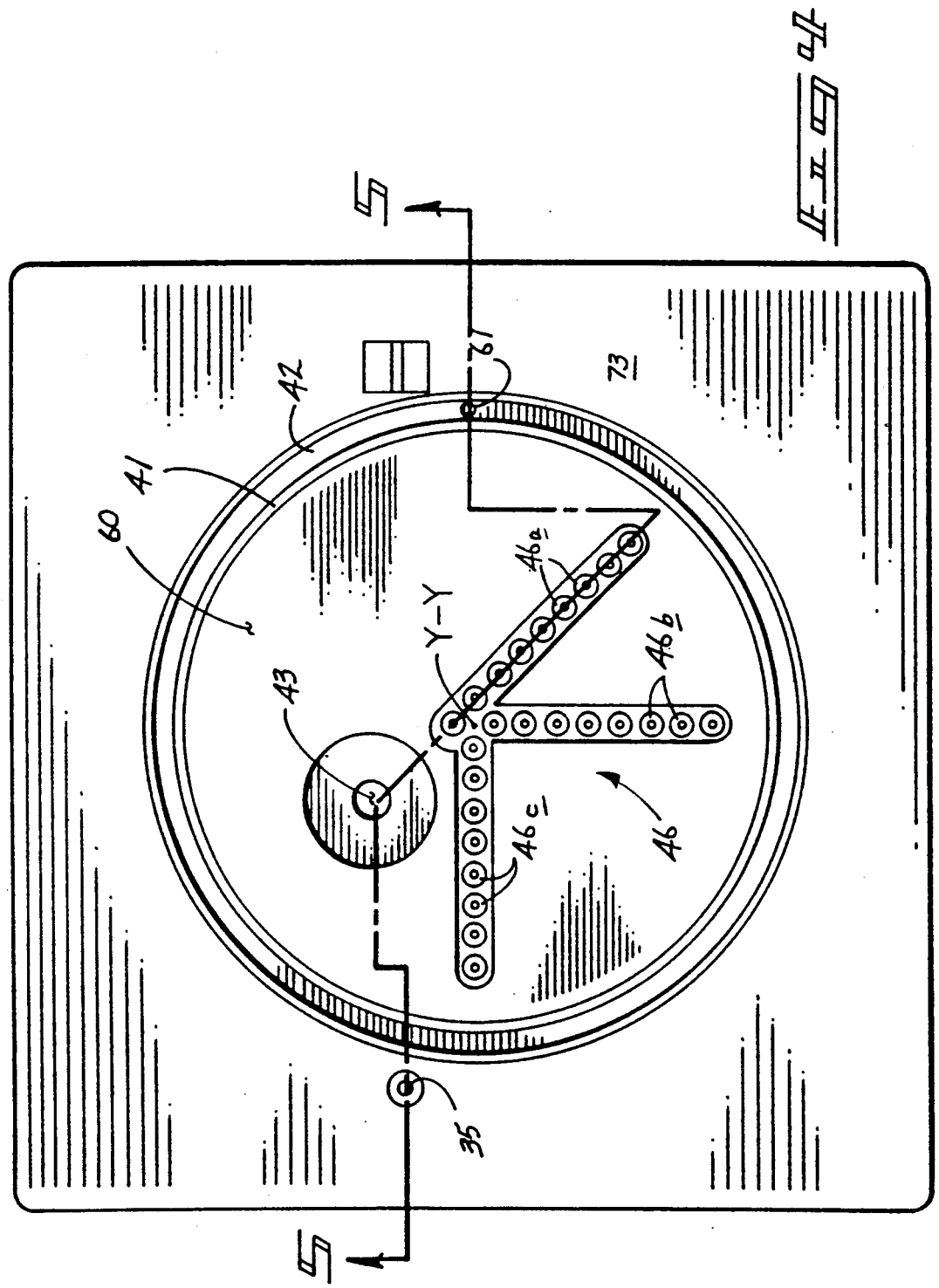
FIG. 4 is a top view of the receiving base included in the processor.

The underside of each foot 33 includes a tapered shoulder 37 that assists in locating the portable module within a receiving opening formed on the supporting base unit. The feet 33 also can be used for fastening the portable module to the base unit, using any selected fastener system that can be released by the carrying robotic arm 52. For instance, each foot 33 might include a recess within which a frictional mechanical fastener on the base unit is received. Other magnetic or electrically-operated fastening assemblies (not shown) can be substituted as required for this purpose. The fastener might also serve more than one purpose, exemplified by the gaseous nitrogen inlet 35 shown at the periphery of the base unit (FIG. 4). This inlet 35 is received within an opening 39 on foot 33a.

When connected, the nitrogen inlet 35 and opening 39 provide a gaseous path to an annular distributor ring 70 that surrounds the inner hub formed on deflector shield 28. The ring 70 forms an annular space through which pressurized nitrogen is distributed about the hub to a series of inwardly-directed apertures 71 leading to a grooved labyrinth 72 (see FIGS. 7 and 8). The flow of pressurized nitrogen is split, with part of the gas flowing through labyrinth 72 and into the motor bearings 15 and most of the gas flowing between flange 31 and the adjacent surface of deflector shield 28. This provides a positive pressure across labyrinth 72, preventing outward passage of particles from bearings 15 and other internal parts within housing 10 from escaping into the wafer processing area. The flow of gas between flange 31 and deflector shield 28 creates a protective curtain that prevents acid fumes and gases from the wafer processing area from entering housing 10 through bearings 15.

The mechanical connection between inlet 35 and opening 39 also prevents relative rotation between the portable housing 10 and the supporting base 51. Other fastening arrangements, including releasable locking fasteners, might be used when mounting the portable housing 10 in a vertical or angularly inclined orientation on a supporting surface 55 as shown in FIG. 1.

A second foot 33b supports a frictional electrical connector 34 that provides multiple electrical paths to and from a complementary stationary connector 49 fixed to the base 51 (see FIGS. 5, 7 and 8). Wires 59 leading from connector 34 to motor 11 can provide power and control signals to the motor 11 from the supporting base 51.

The receiving base 51 is best understood from FIGS. 2, 4 and 5. Bowl 41 includes an open dished surface 60 facing outwardly to receive a wafer 30 supported between posts 25 of the gripper means 24. The dished surface 60 is surrounded by a peripheral drain channel 42 which overlaps the outer edge of the rim formed about the deflector shield 28. Thus, liquid flung onto the deflector shield 28 from the edge of a rotating wafer 30 will be directed into drain channel 42, where it will pass through drain opening 61. A central drain 43 is also provided in open communication with the interior of the dished surface 60. Drain 43 is selectively closable by a movable valve to facilitate filling of the open dished surface 60 for immersion treatment of a wafer 30. A liquid supply means, shown by conduit 44 and inlet valve 62, is in fluid communication with the bowl interior for selectively filling the bowl 41 with liquid for immersion processing. Overflow from within bowl 41 is received in the surrounding drain channel 42.

Drain channel 42 is surrounded by a peripheral vacuum chamber, shown as being bounded by an inwardly extending lip 73 having an inner annular edge adjacent to the periphery of deflector shield 28. Vacuum pressure is applied within the lip 73 through a conduit 74 (FIG. 5) to assure that any particles entering the space between deflector shield 28 and lip 73 are carried off and cannot contaminate the wafer processing area within shield 28.

One or more jet means are provided within bowl 41 for directing liquid outwardly from the dished surface 60 to impinge upon the outwardly facing surface of a wafer 30 located in the bowl. As seen in FIG. 4, the disclosed embodiment includes three sets of such jets, each extending radially outward from a position substantially at the axis Y—Y. FIG. 5 illustrates an aspiration manifold 46a, in which liquid is supplied through a liquid inlet valve 48 and nitrogen or other carrier gas is supplied through a pneumatic inlet valve 47. Jets 46b is a series of aspiration jets for recirculated liquid received from the previously described drain channel 42. The third row of jets 46c is a set of pressure jets wherein liquid under fluid pressure is discharged in parallel jets. The specific jets can be operated in any desired sequence or combination. The spraying of a wafer surface is coordinated with rotational movement of the wafer 30 to assure uniform spray delivery about all wafer surface areas. Rotation also facilitates radial discharge of the liquid after impinging on the wafer surface.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

We claim:

1. A single wafer processor for subjecting at least one surface of a semiconductor wafer to contact with a fluid, comprising:

a support surface;

a bowl mounted to the support surface, the bowl interior having an open dished surface centered about a bowl axis;

closable drain means in fluid communication with a dished surface of the bowl interior for permitting the bowl to fill with liquid for immersion processing of a wafer; and jet means within the bowl for directing liquid outwardly from the dished surface to impinge upon a wafer located in the bowl.

2. The single wafer processor of claim 1 further comprising:

liquid supply means in fluid communication with the bowl interior for selectively filling the bowl with liquid for immersion processing of a wafer.

3. The single wafer processor of claim 1 further comprising:
   a peripheral vacuum chamber surrounding the bowl in open communication with the bowl interior.

4. The single wafer processor of claim 1 wherein the jet means comprises a plurality of parallel jets arranged within the bowl interior.

5. The single wafer processor of claim 1 wherein the jet means comprises a plurality of parallel jets arranged within the bowl interior; and
   common liquid supply means in fluid communication with the jets.

* * * * *